(12) United States Patent
Masuda

(10) Patent No.: US 9,287,224 B2
(45) Date of Patent: Mar. 15, 2016

(54) HIGH-FREQUENCY MODULE

(71) Applicant: FUJITSU LIMITED, Kawasaki-shi, Kanagawa (JP)

(72) Inventor: Satoshi Masuda, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 93 days.

(21) Appl. No.: 14/090,560

(22) Filed: Nov. 26, 2013

(65) Prior Publication Data

US 2014/0264788 A1 Sep. 18, 2014

(30) Foreign Application Priority Data

Mar. 18, 2013 (JP) .................................. 2013-055668

(51) Int. Cl.
*H01L 23/34* (2006.01)
*H01L 23/66* (2006.01)
(Continued)

(52) U.S. Cl.
CPC .............. *H01L 23/66* (2013.01); *H01L 23/045* (2013.01); *H01L 23/047* (2013.01); *H01L 23/49833* (2013.01); *H01L 25/162* (2013.01); *H05K 1/0215* (2013.01); *H05K 3/4697* (2013.01); *H05K 7/20509* (2013.01); *H01L 23/3677* (2013.01); *H01L 24/48* (2013.01); *H01L 24/49* (2013.01); *H01L 2224/06181* (2013.01); *H01L 2224/48091* (2013.01); *H01L 2224/48227* (2013.01); *H01L 2224/4911* (2013.01); *H01L 2924/00014* (2013.01); *H01L 2924/16195* (2013.01); *H01L 2924/19107* (2013.01);

(Continued)

(58) Field of Classification Search
CPC . H01L 23/047; H01L 23/49822; H01L 23/66; H01L 25/0655; H01L 23/49833; H01L 25/162; H01L 2223/6644; H01L 2224/48091; H01L 23/02; H01P 3/02; H05K 1/0243; H05K 1/141; H05K 3/4697
USPC ................... 257/728, 706, 664, 659, 204, 48; 330/133, 124, 302–306, 386, 319
See application file for complete search history.

(56) References Cited

U.S. PATENT DOCUMENTS 4,172,261 A 10/1979 Tsuzuki et al.
2002/0135269 A1 9/2002 Kinoshita
(Continued)

FOREIGN PATENT DOCUMENTS

EP 2645416 10/2013
JP 2003-318319 11/2003
(Continued)

OTHER PUBLICATIONS

EESR—Extended European Search Report dated Oct. 29, 2014 issued with respect to the corresponding European Patent Application No. 13195878.7.

*Primary Examiner* — Dung Le
(74) *Attorney, Agent, or Firm* — Fujitsu Patent Center

(57) ABSTRACT

A high-frequency module includes a lower base member having a recess part formed in an upper face thereof, and having a base metal part formed on a lower face thereof that is to be grounded, an upper substrate disposed inside the recess part of the lower base member, a semiconductor device mounted on an upper face of the upper substrate, a first ground line connected to the semiconductor device and formed on the upper substrate, and a ground metal part connected to the base metal part and disposed in the lower base member, wherein the ground metal part is connected to the first ground line on the upper substrate.

7 Claims, 13 Drawing Sheets

(51) Int. Cl.
*H01L 25/16* (2006.01)
*H01L 23/045* (2006.01)
*H01L 23/047* (2006.01)
*H01L 23/498* (2006.01)
*H05K 3/46* (2006.01)
*H05K 7/20* (2006.01)
*H01L 23/00* (2006.01)
*H01L 23/367* (2006.01)
*H05K 1/02* (2006.01)
*H05K 9/00* (2006.01)

(52) U.S. Cl.
CPC .............. *H05K1/021* (2013.01); *H05K 1/0204* (2013.01); *H05K 9/0039* (2013.01); *H05K 2201/0919* (2013.01); *H05K 2201/09845* (2013.01); *H05K 2201/1056* (2013.01); *H05K 2201/10242* (2013.01); *H05K 2201/10371* (2013.01)

(56) References Cited

U.S. PATENT DOCUMENTS

| | | | |
|---|---|---|---|
| 2003/0169575 | A1 | 9/2003 | Ikuta et al. |
| 2012/0092218 | A1 | 4/2012 | Akasegawa et al. |
| 2013/0257565 | A1* | 10/2013 | Masuda ........................ 333/247 |

FOREIGN PATENT DOCUMENTS

| | | |
|---|---|---|
| JP | 2011-171576 | 9/2011 |
| WO | 2005020288 | 3/2005 |

* cited by examiner

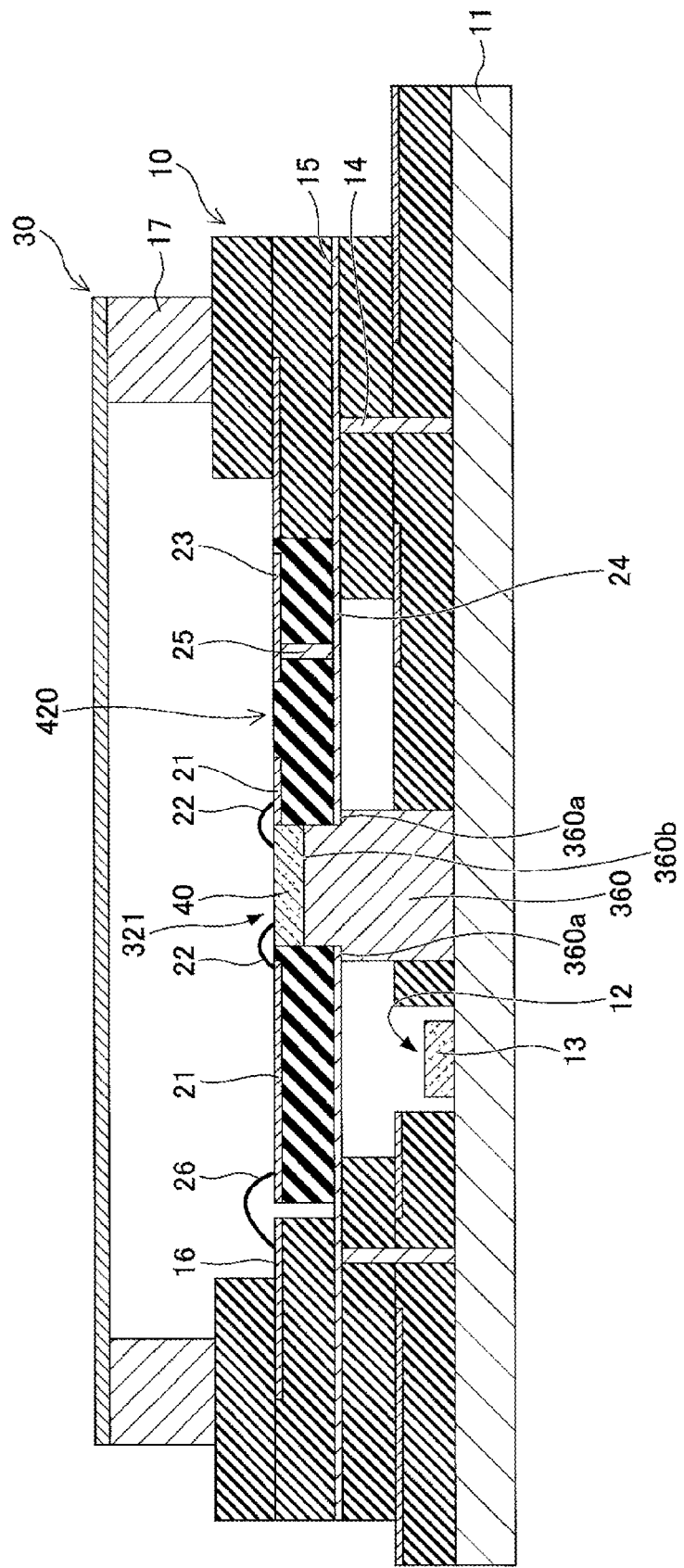

HIGH-FREQUENCY MODULE

CROSS-REFERENCE TO RELATED APPLICATIONS

The present application is based upon and claims the benefit of priority from the prior Japanese Patent Application No. 2013-055668 filed on Mar. 18, 2013, with the Japanese Patent Office, the entire contents of which are incorporated herein by reference.

FIELD

The disclosures herein relate to a high-frequency module.

BACKGROUND

Together with the recent advancement of broadband technology, there has been an increasing demand for large-capacity, high-speed wireless communication. With the aim of increasing capacity, third-generation amplifiers have become widely used, and fourth-generation amplifiers are expected to make a progress. New communication systems such as the LTE (i.e., Long Term Evolution) have been put into practice, which will also serve to advance the trend toward increased capacity. Because of this, increases in output power and efficiency, size reduction, and cost reduction are required. A radar receiver module is expected to have an increased output power and a widened frequency band. Further reduction in operating costs and an increased efficiency for the size reduction of a cooling device are also required. In a phased array radar, radar modules inclusive of amplifiers may need to be arranged in an array form within a limited space. In consideration of this, further size reduction in the radar module is expected.

A conventional transceiver module has a configuration in which semiconductor devices such as amplifiers accommodated in packages are mounted in a metal case. Such a transceiver module tend to become voluminous. Efforts have been made to develop high-frequency packages utilizing an HTCC (i.e., high temperature co-fired ceramics) substrate or a LTCC (i.e., low temperature co-fired ceramics) substrate. Literatures also disclose high-frequency modules in which semiconductor-device electronic components such as amplifiers and filters are mounted on a dielectric multilayer substrate as described above.

Due to a demand for size reduction in high-frequency modules, it is preferable to stack semiconductor-device electronic components in a three dimensional structure. In such a case, however, it is difficult to secure low-loss, wideband performance because a contact failure easily occurs in high frequency.

[Patent Document 1] Japanese Laid-open Patent Publication No. 2011-171576

[Patent Document 2] Japanese Laid-open Patent Publication No. 2003-318319

SUMMARY

According to an aspect of the embodiment, a high-frequency module includes a lower base member having a recess part formed in an upper face thereof, and having a base metal part formed on a lower face thereof that is to be grounded, an upper substrate disposed inside the recess part of the lower base member, a semiconductor device mounted on an upper face of the upper substrate, a first ground line connected to the semiconductor device and formed on the upper substrate, and a ground metal part connected to the base metal part and disposed in the lower base member, wherein the ground metal part is connected to the first ground line on the upper substrate.

According to another aspect of the embodiment, a high-frequency module includes a lower base member having a recess part formed in an upper face thereof, and having a base metal part formed on a lower face thereof that is to be grounded, an upper substrate disposed inside the recess part of the lower base member, a semiconductor device, and a first ground metal part connected to the base metal part and disposed in the lower base member, wherein the upper substrate has a first through hole formed therethrough at a position where the first ground metal part is situated, and the semiconductor device is placed on the first ground metal part in the first through hole.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 13 is an illustrative drawing of yet another high-frequency module of the fourth embodiment.

DESCRIPTION OF EMBODIMENTS

In the following, embodiments will be described by referring to the accompanying drawings. The same elements are referred to by the same numerals, and a description thereof will be omitted.

First Embodiment

Figure 1:
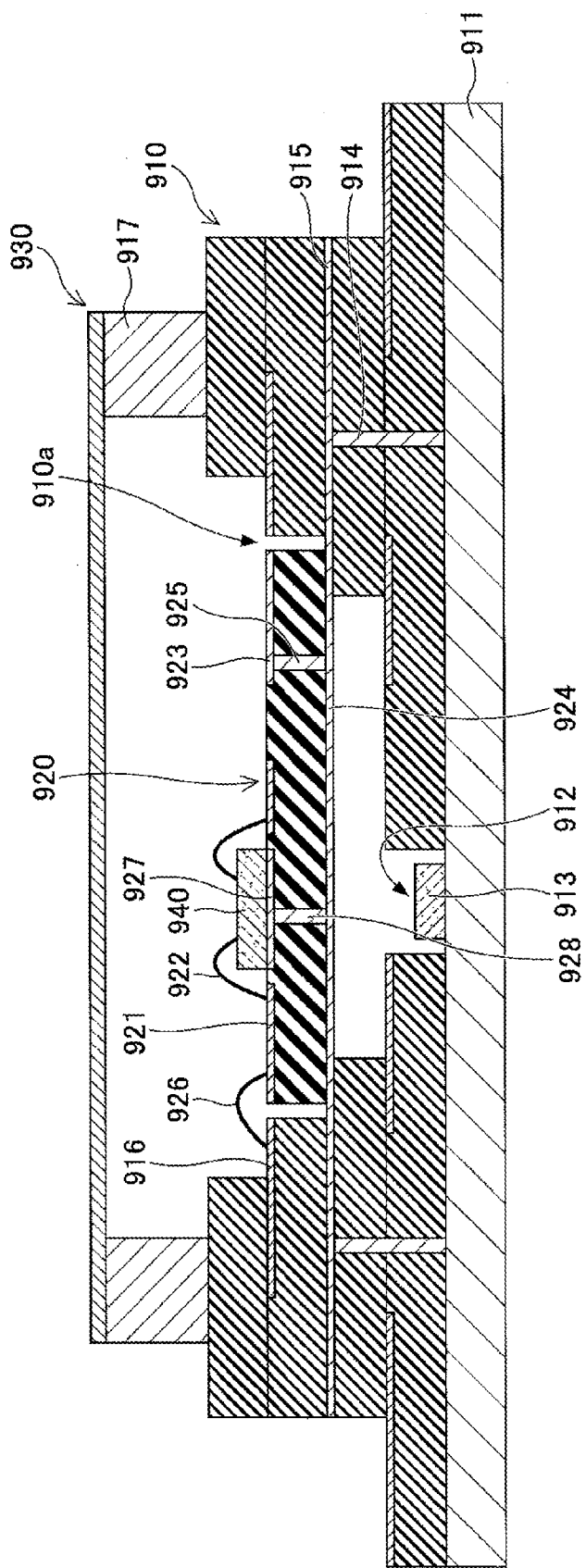
FIG. 1 is a cross-sectional view of a high-frequency module.
Figure 2:
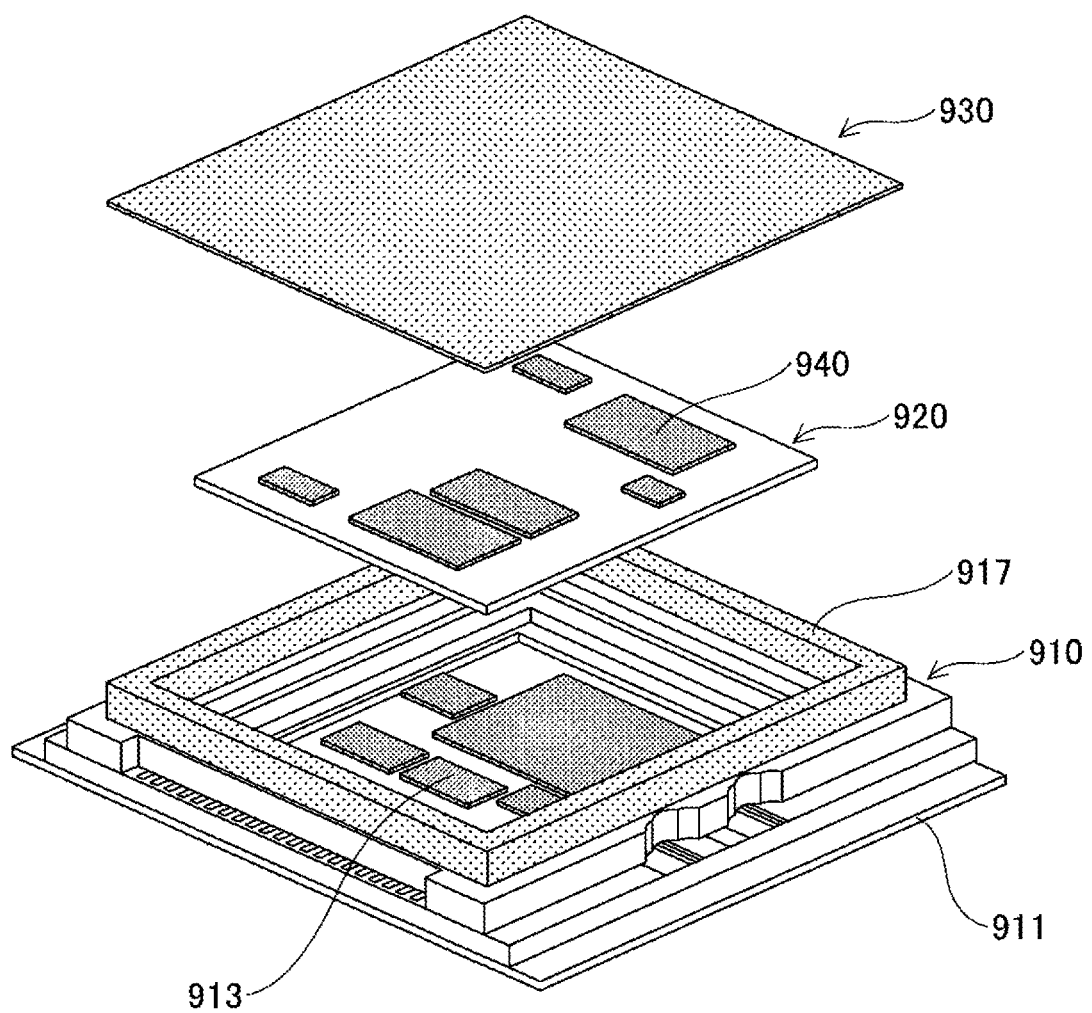
FIG. 2 is a drawing for explaining the structure of the high-frequency module.

With reference to FIG. 1 and FIG. 2, a description will be given of a high-frequency module in which semiconductor-device electronic components and the like are three-dimensionally stacked one over another in a three-dimensional package. FIG. 1 is a cross-sectional view of the high-frequency module. FIG. 2 is an exploded oblique perspective view of the high-frequency module. The high-frequency module includes a lower base member 910, an upper substrate 920, a metal cover member 930.

The lower base member 910 is made of insulating ceramics such as aluminum oxide. Interconnection lines and via lines made of high-melting-point metal such as W or Mo are arranged in the lower base member 910. The lower base member 910 has a recess part 910a formed on an upper face thereof, and the recess part 910a accommodates the upper substrate 920. A base metal part 911 is disposed on the lower face of the lower base member 910 opposite the upper face. The lower base member 910 has a through hole 912 formed at the position where a semiconductor chip (i.e., semiconductor device) 913 is disposed. The semiconductor chip 913 is placed on the surface of the base metal part 911 that is exposed through the through hole 912. The base metal part 911 is made of a material such as copper or alloy inclusive of copper, and is grounded. The base metal part 911 serves as a ground, and also serves to release heat generated by the semiconductor chip 913. The lower base member 910 has a ground via line 914 formed therein that is connected to the base metal part 911, and has a ground line 915 formed therein that is connected to the ground via line 914. A metal frame 917 is disposed on the top upper face of the lower base member 910, and is connected to the metal cover member 930.

The upper substrate 920 is made of insulating ceramics such as aluminum oxide, and has interconnection lines formed of metal material or the like on both faces thereof. A semiconductor chip (semiconductor device) 940 is mounted on an upper face of the upper substrate 920. The semiconductor chip 940 has electrode terminals (not shown) for inputting and outputting signals. These electrode terminals and lines 921 formed on the upper face of the upper substrate 920 are connected to each other through bonding wires 922. Consequently, high-frequency signals or the like input into or output from the semiconductor chip 940 propagate through the lines 921 formed on the upper face of the upper substrate 920.

The upper substrate 920 has a ground line 923 disposed on the upper face thereof and a ground line 924 disposed on the lower face thereof. The ground lines 923 and 924 are connected to each other through a through-hole line 925 extending through the upper substrate 920. Further, the ground line 924 is connected to the ground line 915 disposed in the lower base member 910.

At least one of the lines 921 formed on the upper face of the upper substrate 920 is connected through a bonding wire 926 to a line 916 formed in the lower base member 910. The semiconductor chip 940 is placed on a ground electrode 927 formed on the upper face of the upper substrate 920. A ground terminal (not shown) of the semiconductor chip 940 is connected to the ground electrode 927. It may be noted that the ground electrode 927 is connected through a through line 928 to the ground line 924 formed on the lower face of the upper substrate 920.

The metal cover member 930 is made of metal material such as Kobar, and is bonded to the metal frame 917 disposed on the lower base member 910. In this manner, the metal cover member 930 and the metal frame 917 of the lower base member 910 are bonded together, so that the lower base member 910 and the metal cover member 930 cover the upper substrate 920.

In the high-frequency module having the above-noted structure, the semiconductor chip 940 mounted on the upper face of the upper substrate 920 is grounded through the ground electrode 927, the through line 928, the ground line 924, the ground line 915, the ground via line 914, and the base metal part 911.

In the case of HTCC or LTCC, the lower base member 910 is formed by sintering ceramic. The ground via line 914 and the ground line 915 are thus made of material containing W, Mo, or the like that is high-melting-point metal. Such a high-melting-point metal, however, has higher resistance than copper or the like that is a typical material for interconnection lines. Further, the ground via line 914 and the ground line 915 formed in the lower base member 910 tend to be formed in a relatively thin, long shape. This results in an increase in resistance between the ground (i.e., ground terminal) of the semiconductor chip 940 and the base metal part 911 to which the ground potential is applied. It follows that the ground potential of the semiconductor chip 940 becomes unstable, thereby degrading high-frequency characteristics.

<High-Frequency Module>

Figure 3:
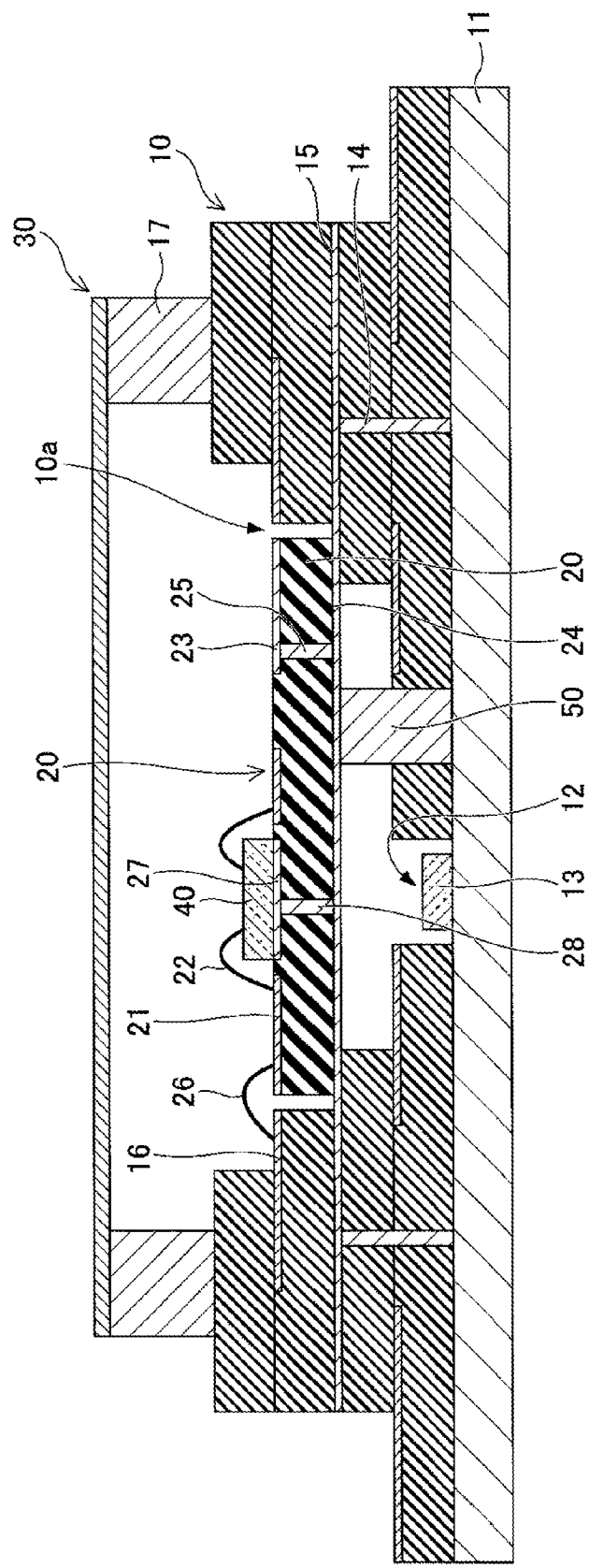
FIG. 3 is a cross-sectional view of a high-frequency module of a first embodiment.

In the following, a high-frequency module of the first embodiment will be described. FIG. 3 is a cross-sectional view illustrating the structure of a high-frequency module according to the present embodiment. The high-frequency module of the present embodiment includes a lower base member 10, an upper substrate 20, a metal cover member 30.

The lower base member 10 is made of insulating ceramics such as aluminum oxide (i.e., alumina). Interconnection lines and via lines made of high-melting-point metal such as W or Mo are arranged in the lower base member 910. The lower base member 10 has a recess part 10a formed on an upper face thereof, and the recess part 10a accommodates the upper substrate 20. A base metal part 10 is disposed on the lower face of the lower base member 11 opposite the upper face. The lower base member 10 has a through hole 12 formed at the position where a semiconductor chip (i.e., semiconductor device) 13 is disposed. The semiconductor chip 13 is placed on the surface of the base metal part 11 that is exposed through the through hole 12. The base metal part 11 is made of a material such as copper or alloy inclusive of copper, and is grounded. The base metal part 11 serves as a ground, and also serves to release heat generated by the semiconductor chip 13. The lower base member 10 has a ground via line 14 formed therein that is connected to the base metal part 11, and has a ground line 15 formed therein that is connected to the ground via line 14. A metal frame 17 is disposed on the top upper face of the lower base member 10, and is connected to the metal cover member 30.

In the present embodiment, the lower base member 10 has a ground metal part 50 connected to the base metal part 11. The ground metal part 50 is connected to a ground line 24 formed on the upper substrate 20, which will be described later. The ground metal part 50 is made of high electrical conductivity material such as copper, and has a thicker width than the ground via line 14 and the like.

In the present embodiment, the lower base member 10 is formed by laminating five alumina ceramics layers each being 0.25 mm in thickness. The metal frame 17 is formed on the top alumina ceramics layer such as to surround the recess part 10a. The base metal part 11 is made of a material such as CuW. The semiconductor chip 13 mounted on the lower base member 10 may be an integrated circuit chip such as an NMIC (i.e., monolithic microwave integrated circuit). Another functional device may be mounted on the base metal part 11.

The upper substrate 20 is made of insulating ceramics such as aluminum oxide, and has interconnection lines formed of metal material or the like on both faces thereof. A semiconductor chip (semiconductor device) 40 is mounted on an upper face of the upper substrate 20. The semiconductor chip 40 has electrode terminals (not shown) for inputting and outputting signals. These electrode terminals and lines 21 formed on the upper face of the upper substrate 20 are connected to each other through bonding wires 22. Consequently, high-frequency signals or the like input into or output from the semiconductor chip 40 propagate through the lines 21 formed on the upper face of the upper substrate 20.

The upper substrate 20 has a ground line 23 disposed on the upper face thereof and a ground line 24 disposed on the lower face thereof. The ground lines 23 and 24 are connected to each other through a through-hole line 25 extending through the upper substrate 20. Further, the ground line 24 is connected to the ground line 15 disposed in the lower base member 10.

At least one of the lines 21 formed on the upper face of the upper substrate 20 is connected through a bonding wire 26 to a line 16 formed in the lower base member 10. The semiconductor chip 40 is placed on a ground electrode 27 formed on the upper face of the upper substrate 20. A ground terminal (not shown) of the semiconductor chip 40 is connected to the ground electrode 27. It may be noted that the ground electrode 27 is connected through a through line 28 to the ground line 24 formed on the lower face of the upper substrate 20.

The metal cover member 30 is made of metal material such as Kobar, and is bonded to the metal frame 17 disposed on the lower base member 10. In this manner, the metal cover member 30 and the metal frame 17 of the lower base member 10 are bonded together, so that the lower base member 10 and the metal cover member 30 cover the upper substrate 20.

The metal cover member 30 may be 0.3 mm in thickness, for example. The metal cover member 30 is formed to have substantially the same size as the metal frame 17. The metal frame 17 and the metal cover member 30 may be bonded to each other through AuSn when heated to a temperature of 300 degrees Celsius in an nitrogen atmosphere, so that the space surrounded by the lower base member 10 and the metal cover member 30 is hermetically encapsulated. A terminal inside this space and a terminal outside this space are connected to each other by use of a feed through structure.

In the high-frequency module of the present embodiment, the semiconductor chip 40 mounted on the upper face of the upper substrate 20 is grounded through the ground electrode 27, the through line 28, the ground line 24, the ground metal part 50, and the base metal part 11. With this arrangement, the line length to provide the ground connection is shorter than in the high-frequency module having the structure illustrated in FIG. 2. Also, the width of the ground metal part 50 is wider than the width of the ground via line 914. The ground metal part 50 is made of copper or a material containing copper. The ground metal part 50 has resistance lower than the resistance of W or Mo that constitutes the ground via line 914 and 915. With this arrangement, the resistance between the ground of the semiconductor chip 40 and the base metal part 11 to which the ground potential is applied is made lower than in the case of the high-frequency module illustrated in FIG. 2. This serves to prevent the potential of the ground of the semiconductor chip 40 from becoming unstable, thereby suppressing the degradation of high-frequency characteristics. Accordingly, the high-frequency module of the present embodiment has low loss characteristics in a wide frequency range.

<Transmission and Reflection Characteristics>

In the following, a description will be given of the transmission and reflection characteristics of the high-frequency module of the present embodiment having the structure illustrated in FIG. 3 and the high-frequency module having the structure illustrated in FIG. 2.

Figure 4A:
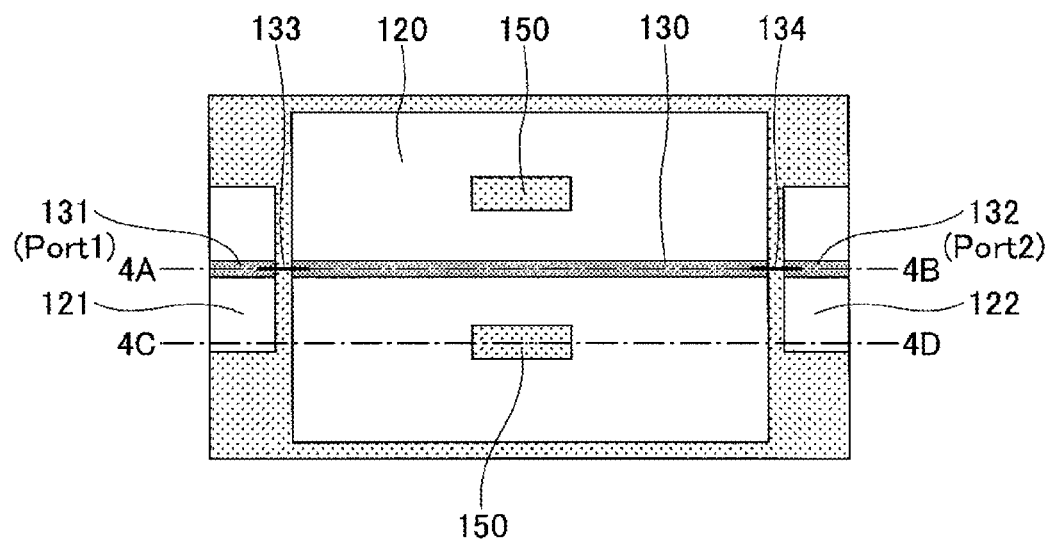
FIGS. 4A through 4C are drawings illustrating a model used in simulation.
Figure 4B:
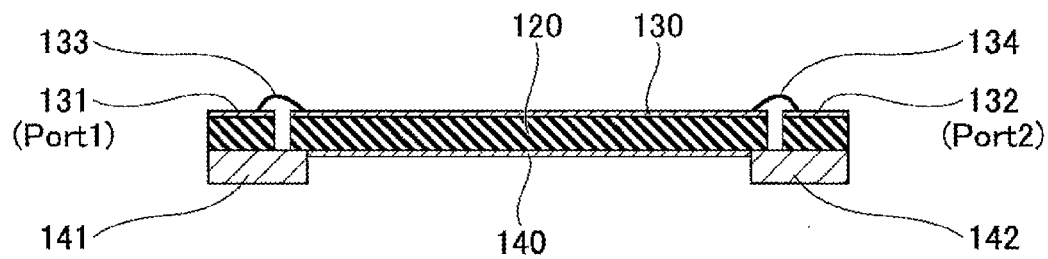
Figure 4C:
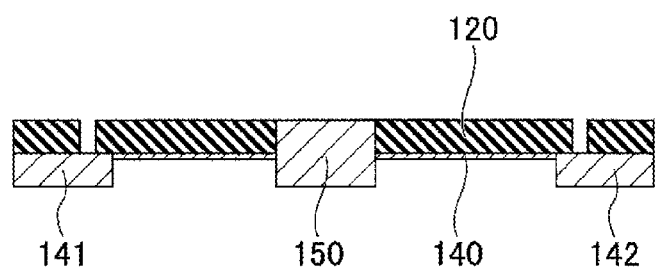

FIGS. 4A through 4C are drawings illustrating a model of the high-frequency module of the present embodiment illustrated in FIG. 3. FIG. 4A is a top view of the model. FIG. 4B is a cross-sectional view taken along the chain line 4A-4B is a cross-sectional view taken along the chain line 4A-4B illustrated in FIG. 4A. FIG. 4C is a cross-sectional view taken along the chain line 4C-4D illustrated in FIG. 4A.

The model illustrated in FIGS. 4A through 4C has a line 130 which is formed on a first face of a substrate 120 that is made of an insulating material, and through which a signal propagates. The model also has a ground line 140 formed on a second face of the substrate 120 opposite the first face. The model illustrated in FIGS. 4A through 4C has an electrode 131 serving as an input port (Port1) and an electrode 132 serving as an output port (Port2). The line 130 and the electrode 131 are connected to each other through a bonding wire 133. The line 130 and the electrode 132 are connected to each other through a bonding wire 134. The signal applied to the electrode 131 serving as the input port (Port1) propagates through the bonding wire 133, the line 130, and the bonding wire 134 to be output from the electrode 132 serving as the output node (Port2).

The ground line 140 formed on the second face of the substrate 120 is connected to a ground electrode 141 disposed on the input side and to a ground electrode 142 disposed on the output side. Further, a ground electrode 150 extending through the substrate 120 is also provided in the model illustrated in FIG. 4. The ground electrodes 141, 142, and 150 are connected to the ground. In the model illustrated in FIGS. 4A through 4C, the ground electrode 150 corresponds to the ground metal part 50 of the present embodiment illustrated in FIG. 3. The ground line 140 corresponds to the ground line 24, and the line 130 corresponds to the lines 21 and the like.

Figure 5A:
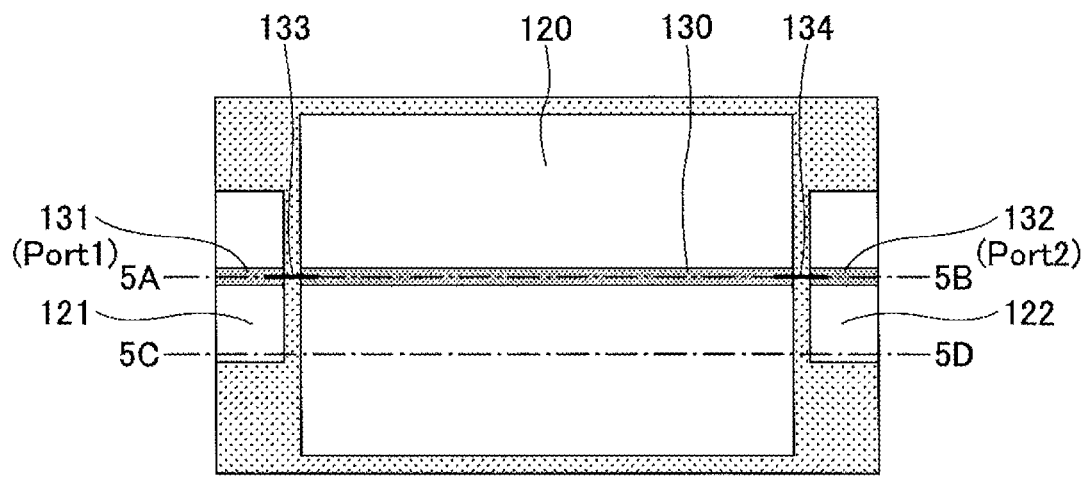
FIGS. 5A through 5C are drawings illustrating a model used in simulation.
Figure 5B:
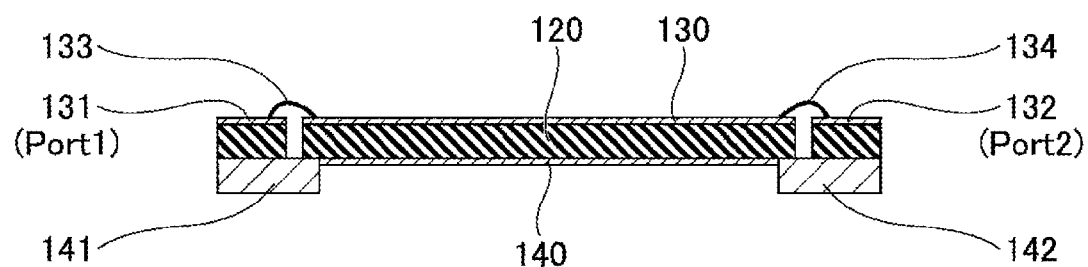
Figure 5C:
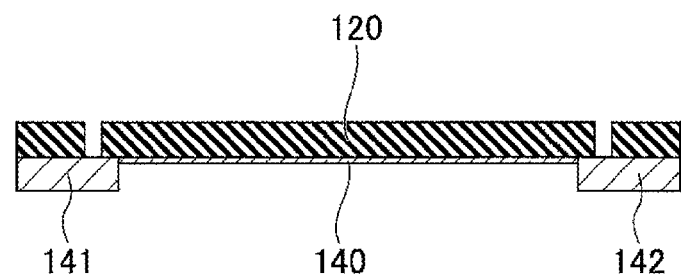

FIGS. 5A through 5C are drawings illustrating a model of the high-frequency module illustrated in FIG. 2. FIG. 5A is a top view of the model. FIG. 5B is a cross-sectional view taken along the chain line 5A-5B illustrated in FIG. 5A. FIG. 5C is a cross-sectional view taken along the chain line 5C-5D illustrated in FIG. 5A.

The model illustrated in FIGS. 5A through 5C are substantially the same as the model illustrated in FIGS. 4A through 4C, except for the absence of the ground electrode 150. In the model illustrated in FIGS. 5A through 5C, the ground electrodes 141 and 142 are grounded. The ground line 140 corresponds to the ground line 924 of the high-frequency module illustrated in FIG. 2. The line 130 corresponds to the lines 921 and the like.

Figure 6:
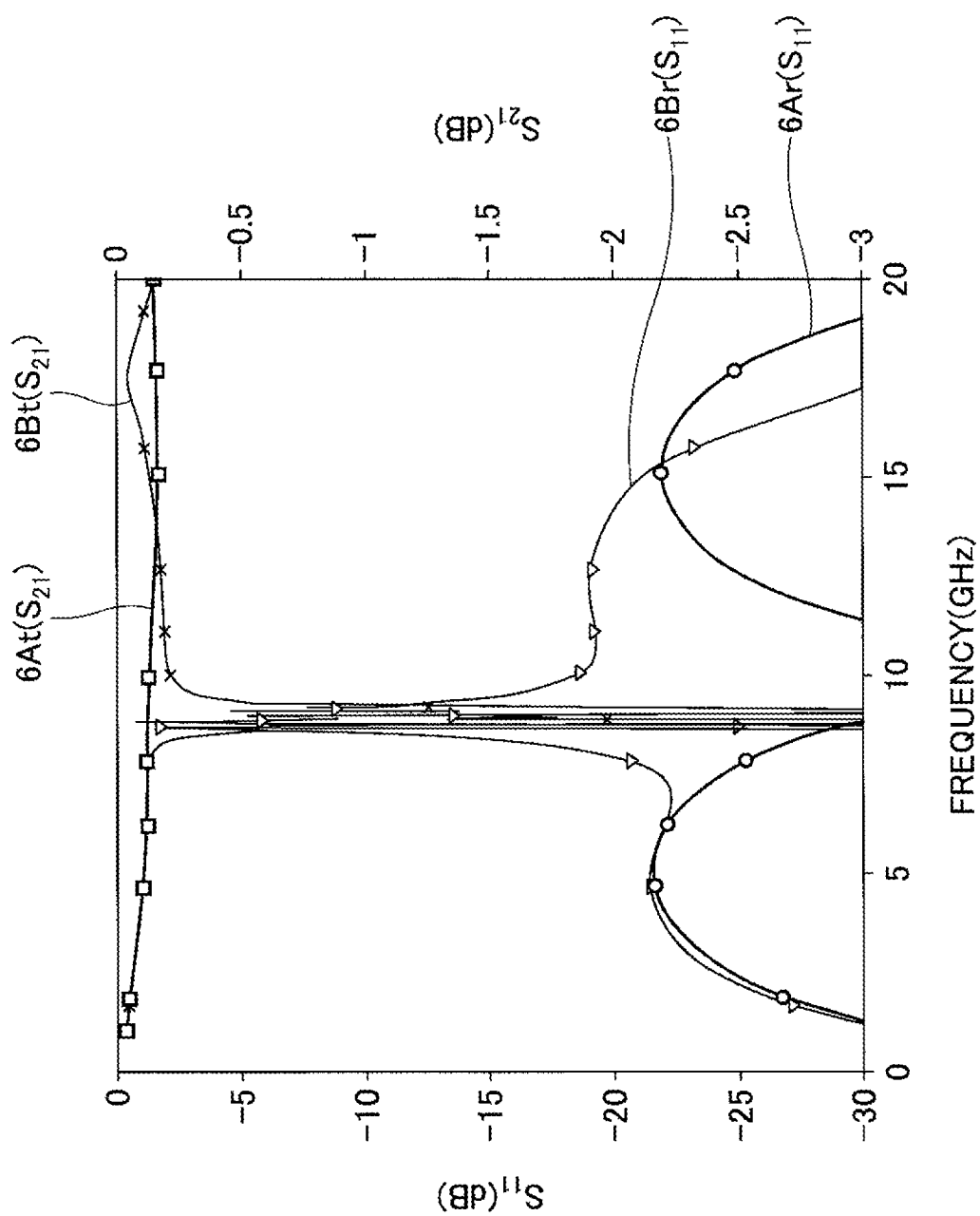
FIG. 6 is a drawing illustrating the transmission and reflection characteristics obtained by the simulations.

FIG. 6 is a drawing illustrating the results of simulation conducted with respect to the model illustrated in FIGS. 4A through 4C and the model illustrated in FIGS. 5A through 5C. In FIG. 6, a transmission characteristic curve 6At represents the transmission characteristics ($S_{21}$) of the model of the high-frequency module according to the present embodiment illustrated in FIGS. 4A through 4C, and a reflection characteristic curve 6Ar represents the reflection characteristics ($S_{11}$) of this model. Further, a transmission characteristic curve 6Bt represents the transmission characteristics ($S_{21}$) of the model illustrated in FIGS. 5A through 5C, and a reflection characteristic curve 6Br represents the reflection characteristics ($S_{11}$) of this model. This simulation was conducted under the conditions that the substrate 120 had a length of 8 mm, a width of 0.25 mm, and a relative permittivity of 9.9.

As illustrated in FIG. 6, the transmission characteristics curve 6Bt($S_{21}$) of the model illustrated in FIG. 5 exhibits a transmission loss having a sudden drop at around a frequency of 8 GHz. In accordance with this, the reflection increases as illustrated by the reflection characteristic curve 6Br($S_{11}$). In contrast, the transmission characteristic curve 6At($S_{21}$) of the model of the high-frequency module according to the present embodiment illustrated in FIGS. 4A through 4C has a transmission loss that is no larger than 0.2 dB in a frequency range under 20 GHz. The reflection characteristic curve 6Ar($S_{11}$)

also demonstrates reflection that is under −20 dB. As described above, the model illustrated in FIGS. 4A through 4C that represents the high-frequency module of the present embodiment illustrated in FIG. 3 has lower loss in a wide frequency range than the model illustrated in FIGS. 5A through 5C that represents the high-frequency module illustrated in FIG. 2. Accordingly, the high-frequency module of the present embodiment has low loss characteristics in a wide frequency range.

This is because the model illustrated in FIGS. 5A through 5C corresponding to the high-frequency module illustrated in FIG. 2 has a grounded inductance at the center of the substrate 120 that has a high impedance in high frequencies. Especially at points that are at a distance equal to ¼ of the signal wavelength from the ground electrodes 141 and 142, a grounded impedance becomes infinitely large, being significantly different from the ideal ground characteristics. On the other hand, the model illustrated in FIGS. 4A through 4C corresponding to the high-frequency module illustrated in FIG. 3 is configured such that the ground electrode 150, in addition to the ground electrodes 141 and 142, is disposed at the center of the substrate 120, thereby preventing a significant deviation from the ideal ground characteristics. It may be noted that the ground electrodes are preferably arranged at intervals that are shorter than or equal to ½ of the wavelength. Namely, the ground electrode 150 is preferably arranged such that the distance from the ground electrode 150 to the ends of the substrate 120 at which the ground electrodes 141 and 142 are situated is shorter than or equal to ½ of the wavelength. The wavelength noted above is defined as an effective wavelength. In a dielectric substance, for example, an effective wavelength is a wavelength in vacuum divided by the square root of an effective dielectric constant.

Second Embodiment

Figure 7:
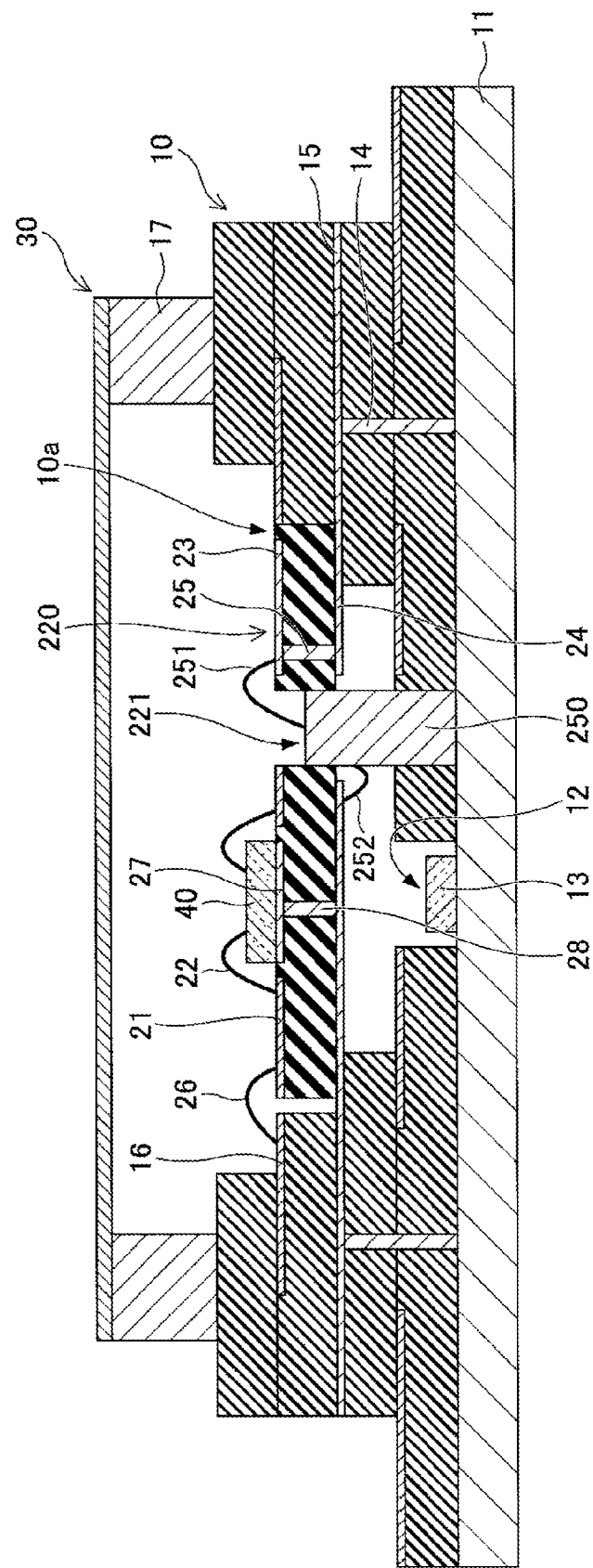
FIG. 7 is a cross-sectional view of a high-frequency module of a second embodiment.

In the following, a second embodiment will be described. The high-frequency module of the present embodiment has a through hole 221 formed in a substrate 220 as illustrated in FIG. 7, and a ground metal part 250 intrudes into the through hole 221 of the substrate 220. The ground metal part 250 is connected through a bonding wire 251 to the ground line 23 formed on the upper face of the upper substrate 220. Further, the ground metal part 250 is connected to the base metal part 11 in the lower base member 10. The ground metal part 250 is also connected through a bonding wire 252 to the ground line 24 formed on the lower face of the upper substrate 220.

In the present embodiment, the use of the structure illustrated in FIG. 7 can further lower the ground resistance. This serves to prevent the potential of the ground of the semiconductor chip 40 or the like from becoming unstable, thereby providing a high-frequency module that has a lower loss in a wide frequency range. Configurations other than those described above are the same as or similar to those of the first embodiment.

Third Embodiment

Figure 8:
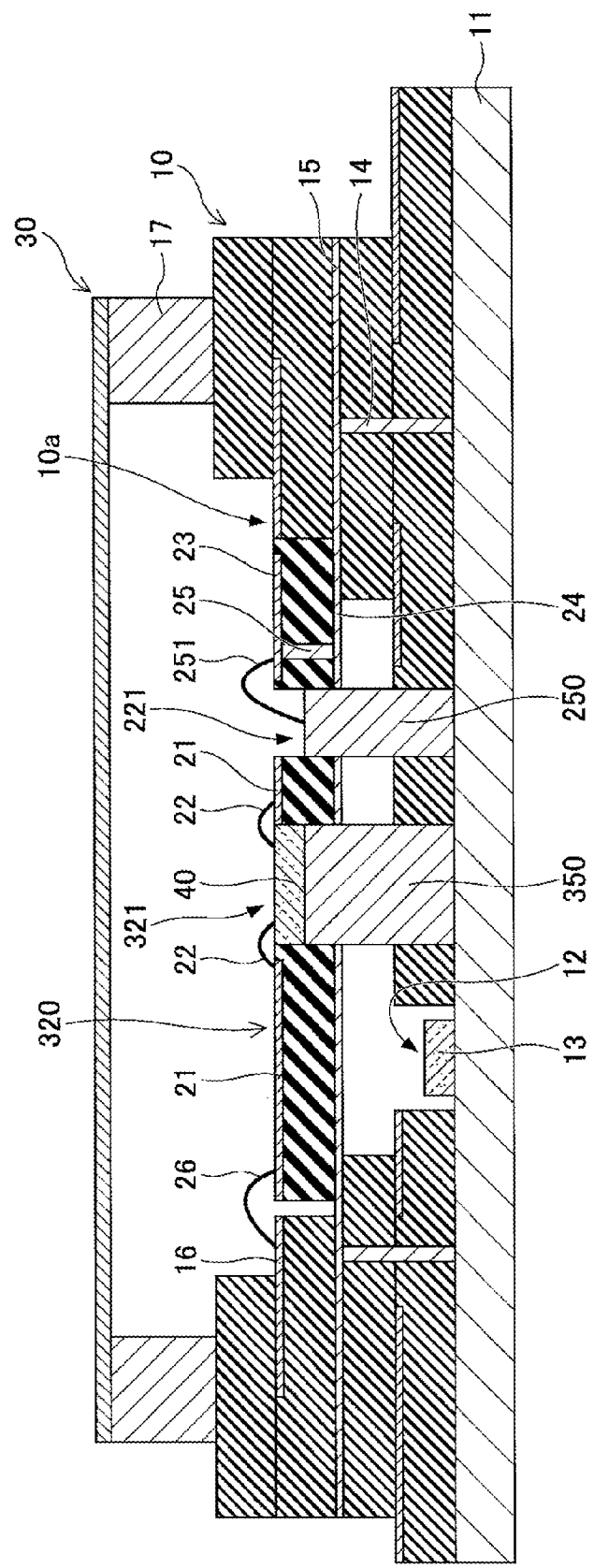
FIG. 8 is a cross-sectional view of a high-frequency module of a third embodiment.
Figure 9:
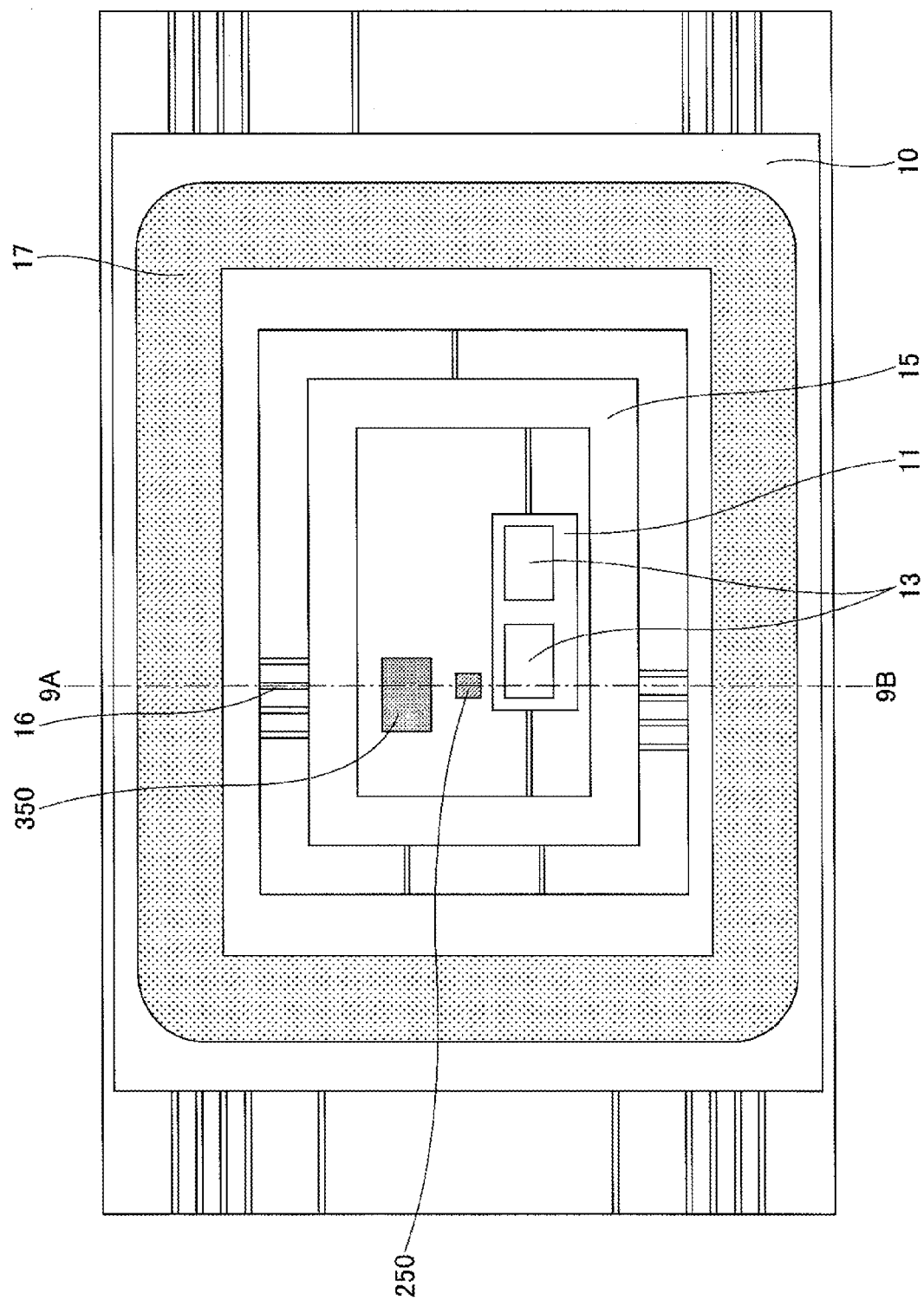
FIG. 9 is an illustrative drawing of the high-frequency module of the third embodiment.
Figure 10:
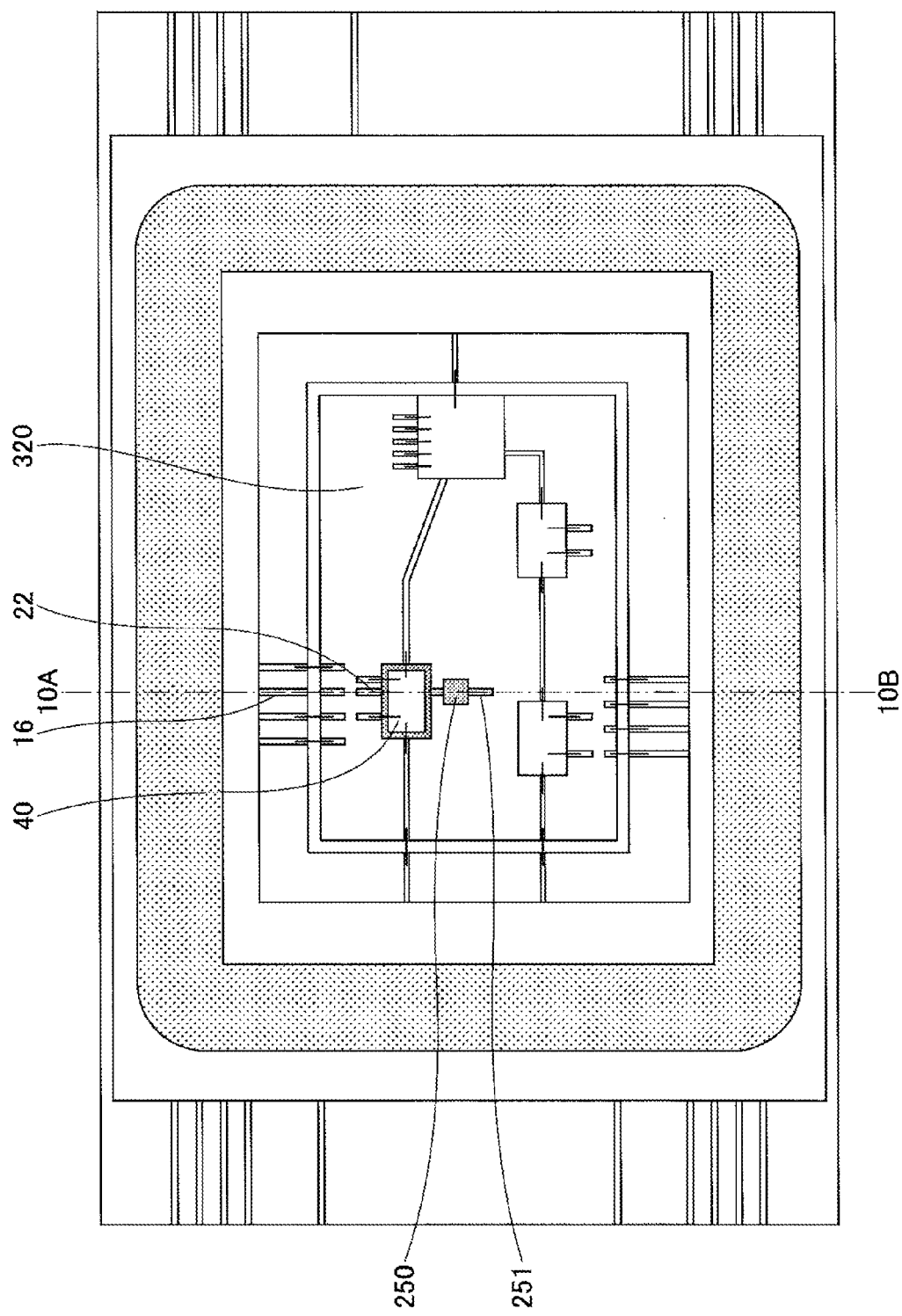
FIG. 10 is an illustrative drawing of the high-frequency module of the third embodiment.

In the following, a third embodiment will be described. The high-frequency module of the present embodiment has a structure in which a ground metal part 350 is situated under the semiconductor chip 40 as illustrated in FIG. 8 through FIG. 10. Namely, the ground metal part 350, which is provided in the lower base member 10, has the semiconductor chip 40 disposed thereon. FIG. 8 is a cross-sectional view illustrating the high-frequency module according to the present embodiment. FIG. 9 is a top view of the high-frequency module of the present embodiment viewed through the metal cover member 30 and an upper substrate 320. FIG. 10 is a top view of the high-frequency module of the present embodiment viewed through the metal cover member 30. The cross-sectional view illustrated in FIG. 8 corresponds to a cross-section taken along the line 9A-9B illustrated in FIG. 9, and also corresponds to a cross-section taken along the line 10A-10B illustrated in FIG. 10.

The high-frequency module of the present embodiment includes an upper substrate 320 that has through holes 221 and 321 formed therein. Further, the lower base member 10 has the ground metal parts 250 and 350 connected to the base metal part 11. The ground metal part 250 intrudes into the through hole 221 of the upper substrate 320, and the ground metal part 350 intrudes into the through hole 321 of the upper substrate 320. Similarly to the second embodiment, the ground metal part 250 of the present embodiment is connected through the bonding wire 251 to the ground line 23 formed on the upper face of the upper substrate 320. Further, the semiconductor chip 40 is placed on the ground metal part 350 in the through hole 321 of the upper substrate 320. A ground terminal (not shown) of the semiconductor chip 40 is connected to the ground metal part 350.

In the present embodiment, the connection between the ground terminal (not shown) of the semiconductor chip 40 and the ground metal part 350 allows the semiconductor chip 40 mounted on the upper face of the upper substrate 320 to be grounded through the ground metal part 350 and the base metal part 11. With this arrangement, the resistance between the ground of the semiconductor chip 40 and the base metal part 11 to which the ground potential is applied is made further lower. Moreover, the ground metal part 350 that is made of copper or a material containing copper ensures that heat generated by the semiconductor chip 40 is efficiently released.

In the present embodiment, the ground metal part 350 may be referred to as a first metal part, and the ground metal part 250 may be referred to as a second metal part. Further, the through hole 321 formed in the upper substrate 320 may be referred to as a first through hole, and the through hole 221 may be referred to as a second through hole.

Configurations other than those described above are the same as or similar to those of the second embodiment.

Fourth Embodiment

Figure 11:
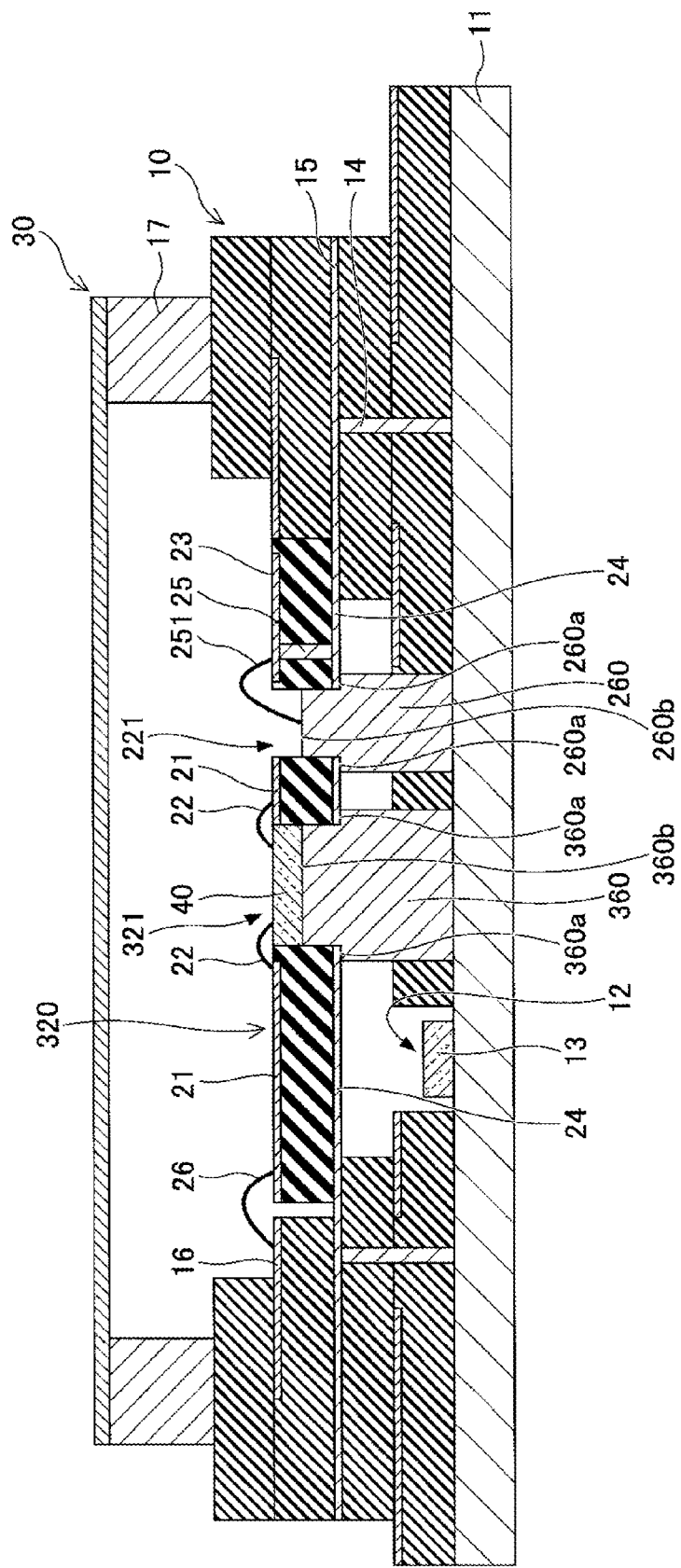
FIG. 11 is a cross-sectional view of a high-frequency module of a fourth embodiment.

In the following, a fourth embodiment will be described. The high-frequency module of the present embodiment is configured as illustrated in FIG. 11 such that ground metal parts 260 and 360 are connected to the ground line 24 formed on the opposite face of the upper substrate 320. In the present embodiment, the ground metal part 360 may be referred to as a first metal part, and the ground metal part 260 may be referred to as a second metal part. Further, the through hole 321 formed in the upper substrate 320 may be referred to as a first through hole, and the through hole 221 may be referred to as a second through hole.

The high-frequency module of the present embodiment includes the ground metal parts 260 and 360 that are disposed in the lower base member 10 and connected to the base metal part 11. The ground metal part 260 has a step part 260*a* for connection with the ground line 24 formed on the upper substrate 320, and has a tip part 260*b* that has a substantially flat face at a position higher than the step part 260*a*. The ground metal part 360 has a step part 360*a* for connection with the ground line 24 formed on the upper substrate 320, and has a tip part 360b that has a substantially flat face at a position higher than the step part 360a.

The tip part 260b of the ground metal part 260 intrudes into the through hole 221 of the upper substrate 320, and the tip part 360b of the ground metal part 360 intrudes into the through hole 321. The ground metal part 260 and the ground line 24 formed on the lower face of the upper substrate 320 are connected to each other at the step part 260a formed on the ground metal part 260. The ground metal part 360 and the ground line 24 formed on the lower face of the upper substrate 320 are connected to each other at the step part 360a formed on the ground metal part 360.

In the present embodiment, the tip part 260b of the ground metal part 260 is connected through the bonding wire 251 to the ground line 23 formed on the upper face of the upper substrate 320. Further, the semiconductor chip 40 is placed on the tip part 360b of the ground metal part 360 in the through hole 321 of the upper substrate 320. A ground terminal (not shown) of the semiconductor chip 40 is connected to the tip part 360b of the ground metal part 360.

In the present embodiment, the ground metal parts 260 and 360 and the ground line 24 formed on the lower face of the upper substrate 320 are connected together, thereby further lowering the ground resistance. Moreover, in the present embodiment, the ground metal parts 260 and 360 and the ground line 24 formed on the lower face of the upper substrate 320 are connected together, so that a substrate having no through line such as the through line 25 may be used as the upper substrate 320.

Figure 12:
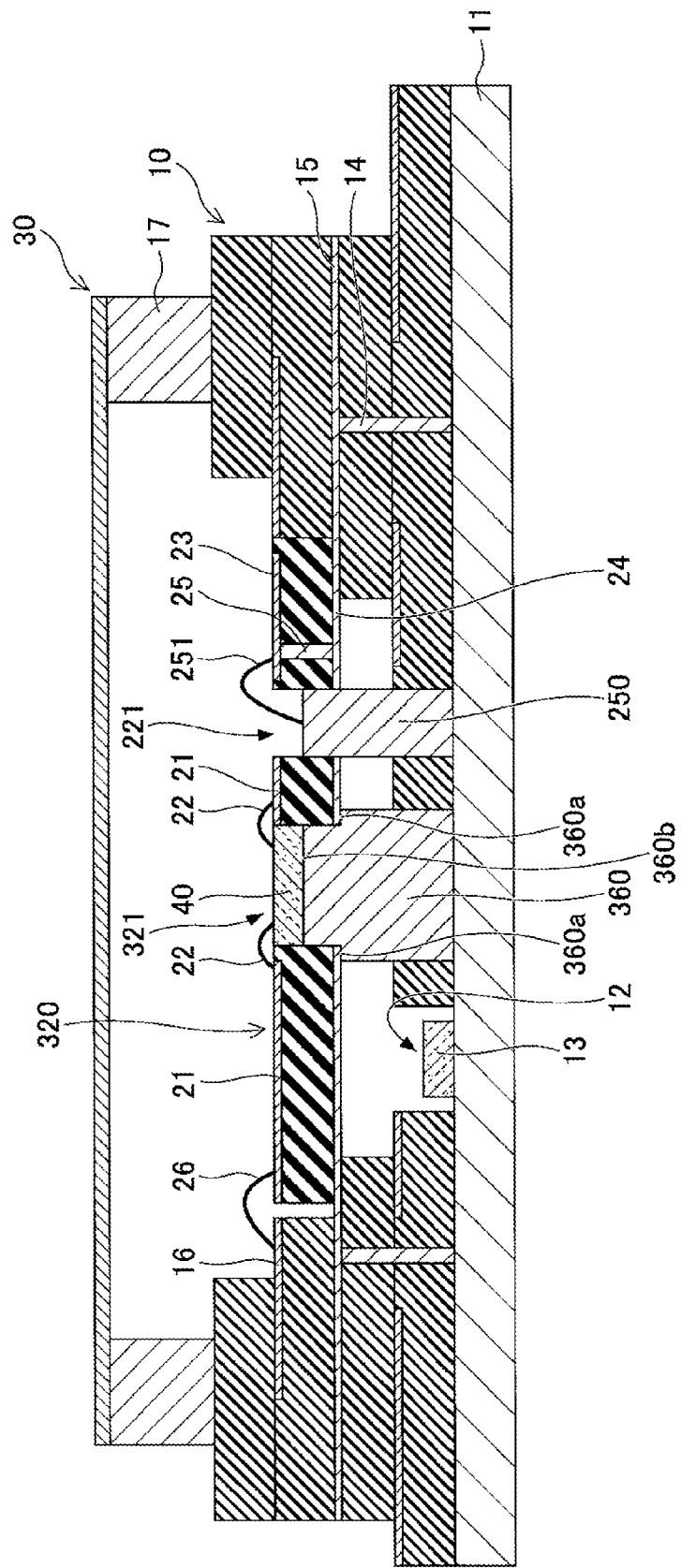
FIG. 12 is an illustrative drawing of another high-frequency module of the fourth embodiment.

The high-frequency module of the present embodiment may be configured as illustrated in FIG. 12 such that ground metal part 250 of the second or third embodiment may be used in place of the ground metal part 260.

Moreover, the high-frequency module of the present embodiment may be configured as illustrated in FIG. 13 such that no ground metal part 260 is provided. In this case, an upper substrate 420 is used in which the through hole 321 is formed but the through hole 221 is not formed.

Moreover, the high-frequency module of the present embodiment may be configured such that the ground metal part 260 is formed but the ground metal part 360 is not formed.

As described above, the disclosed semiconductor device provides a high-frequency module that has low-loss characteristics over a wide frequency range.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A high-frequency module, comprising:
   a lower base member having a recess part formed in an upper face thereof, and having a base metal part formed on a lower face thereof that is to be grounded;
   an upper substrate disposed inside the recess part of the lower base member;
   a semiconductor device mounted on an upper face of the upper substrate;
   a first ground line connected to the semiconductor device and formed on the upper substrate; and
   a ground metal part connected to the base metal part and disposed in the lower base member,
   wherein the ground metal part is made of material containing copper and is connected to the first ground line on the upper substrate.

2. The high-frequency module as claimed in claim 1, further comprising a second ground line formed on an upper face of the upper substrate, the first ground line being formed on a lower face of the upper substrate, and the second ground line being connected to the first ground line through a first through line extending through the upper substrate, wherein the semiconductor device is connected to the first ground line formed on the lower face of the upper substrate through a second through line, and the first ground line formed on the lower face of the upper substrate is connected to the ground metal part.

3. The high-frequency module as claimed in claim 1, further comprising a second ground line formed on an upper face of the upper substrate, the first ground line being formed on a lower face of the upper substrate, and the second ground line being connected to the first ground line through a first through line extending through the upper substrate,
   wherein the semiconductor device is connected to the first ground line formed on the lower face of the upper substrate through a second through line,
   and wherein the upper substrate has a through hole formed therethrough into which the ground metal part intrudes, and the second ground line formed on the upper face of the upper substrate is connected to the ground metal part intruding into the through hole.

4. The high-frequency module as claimed in claim 3, wherein the ground metal part has a step part formed thereon, and the first ground line formed on the lower face of the upper substrate is connected to the ground metal part at the step part of the ground metal part.

5. The high-frequency module as claimed in claim 1, further comprising a line formed on an upper face of the upper substrate through which a signal input into or output from the semiconductor device propagates.

6. The high-frequency module as claimed in claim 1, further comprising a metal cover member bonded to the upper face of the lower base member, wherein the bonding of the metal cover member to the lower base member causes the upper substrate to be encapsulated in the lower base member and the metal cover member.

7. The high-frequency module as claimed in claim 6, wherein the lower base member and the metal cover member are bonded to each other through a metal frame disposed on the upper face of the lower base member.

* * * * *